(12) United States Patent
Huang

(10) Patent No.: US 11,442,099 B2
(45) Date of Patent: Sep. 13, 2022

(54) TESTING DEVICE AND TESTING METHOD FOR PERFORMING AN ELECTRICAL STRESS TEST AND A POWER-ON TEST ON AN ARRAY SUBSTRATE OF A DISPALY PANEL

(71) Applicant: HKC CORPORATION LIMITED, Shenzhen (CN)

(72) Inventor: Bei Zhou Huang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 693 days.

(21) Appl. No.: 16/327,317

(22) PCT Filed: Nov. 1, 2018

(86) PCT No.: PCT/CN2018/113374
§ 371 (c)(1),
(2) Date: Feb. 21, 2019

(87) PCT Pub. No.: WO2020/077685
PCT Pub. Date: Apr. 23, 2020

(65) Prior Publication Data
US 2021/0325448 A1   Oct. 21, 2021

(30) Foreign Application Priority Data
Oct. 16, 2018   (CN) .......................... 201811199593.3

(51) Int. Cl.
*G01R 31/28* (2006.01)
*G02F 1/1362* (2006.01)

(52) U.S. Cl.
CPC ..... *G01R 31/2844* (2013.01); *G01R 31/2831* (2013.01); *G02F 1/136254* (2021.01)

(58) Field of Classification Search
None
See application file for complete search history.

(56) References Cited

U.S. PATENT DOCUMENTS

| 6,700,398 B1* | 3/2004 | Co ................. G01R 31/318505 324/756.02 |
| 10,025,039 B1 | 7/2018 | Cummings et al. |

FOREIGN PATENT DOCUMENTS

| CN | 1573341 A | 2/2005 |
| CN | 1677178 A | 10/2005 |
| CN | 101233444 A | 7/2008 |
| CN | 101299125 A | 11/2008 |
| CN | 101398457 A * | 4/2009 |
| CN | 101398457 A | 4/2009 |
| CN | 103309065 A | 9/2013 |
| CN | 103424910 A | 12/2013 |

(Continued)

OTHER PUBLICATIONS

CN101398457 Machine English Translation (Year: 2009).*

(Continued)

*Primary Examiner* — Douglas X Rodriguez (57) ABSTRACT

The present application discloses a testing device of array substrates and a testing method. The testing device of array substrates includes: a machine and testing interfaces, the testing interfaces being disposed on the machine; and testers disposed above the machine. There are at least two sets of testers, and the testers synchronously operate according to a preset scheme.

6 Claims, 4 Drawing Sheets

(56) References Cited

FOREIGN PATENT DOCUMENTS

CN 104698657 A 6/2015
KR 20020054170 A 7/2002

OTHER PUBLICATIONS

International Search Report issued in corresponding International application No. PCT/CN2018/113374, dated Jul. 23, 2019 (6 pages).
First Office Action from China patent office in a counterpart Chinese patent Application 201811199593.3, dated Jun. 3, 2020 (9 pages).
Written Opinion of the International Searching Authority for No. PCT/CN2018/113374.

* cited by examiner

TESTING DEVICE AND TESTING METHOD FOR PERFORMING AN ELECTRICAL STRESS TEST AND A POWER-ON TEST ON AN ARRAY SUBSTRATE OF A DISPALY PANEL

The present application claims priority to the Chinese Patent Application No. CN201811199593.3, filed to the Chinese Patent Office on Oct. 16, 2018, and entitled "TESTING DEVICE OF ARRAY SUBSTRATES AND TESTING METHOD", which is incorporated herein by reference in its entirety.

TECHNICAL FIELD

The present application relates to the technical field of display, and in particular, to a testing device of array substrates and a testing method.

BACKGROUND

The statements herein merely provide background information related to the present application and do not necessarily constitute the prior art.

A display with active switch control includes a liquid crystal display, an Organic Light-Emitting Diode (OLED) display, etc. The liquid crystal display has many advantages such as thin body, power-saving, and no radiation, and thus has been widely used. The operating principle of the liquid crystal panel is to place liquid crystal molecules in two parallel glass substrates, and apply a driving voltage on the two glass substrates to control the rotation direction of the liquid crystal molecules to refract the light of the backlight module to generate a picture. The OLED display has many advantages such as self-illumination, short response time, high definition and contrast, flexible display and large-area full-color display, and its superior performance and huge market potential have attracted many manufacturers and scientific research institutions all over the world to invest in the production and research and development of OLED array substrates.

An array component performance testing machine has two sets of testers. The original testing method adopts a single tester action. During measurement, the tester first carries out an electrical stress test, and then starts a power-on test (called testing). In the whole testing process, the tester needs to first carry out the electrical stress test every time it moves to the testing position, and then start the testing. The testing time is equal to a sum of the electrical stress test time and the testing time. The whole testing process is long in time and low in efficiency.

SUMMARY

The present application provides a testing method for a testing device of array substrates capable of reducing the testing process time and improving the testing efficiency.

To achieve the foregoing objective, the present application provides a testing device of array substrates, including: a machine, configured to place a plurality of array substrates to be tested; testing interfaces disposed on the machine and corresponding to each of the array substrates; and testers disposed above the machine and matched with the testing interfaces, a length of the tester being at least equal to a width of a testing region of the machine, to carry out an electrical stress test and a power-on test on the array substrates, where there are at least two sets of testers, and the testers synchronously operate according to a preset scheme.

Optionally, the testers include a first tester and a second tester; the first tester is located in front of the second tester in a testing direction; and the preset scheme includes: the first tester carries out the electrical stress test, and the second tester carries out the power-on test.

Optionally, a length of the tester is at least equal to a width of a testing region of the machine; when starting operating, the second tester first carries out the electrical stress test and then carries out the power-on test; and then the second tester only carries out the power-on test on the testing interfaces tested by the first tester.

Optionally, the preset scheme includes: averagely dividing the testing interfaces into at least two sets, each set of the testers correspondingly testing a set of the testing interfaces.

Optionally, the testers include a first tester and a second tester; the preset scheme includes: setting initial positions of the first tester and the second tester at both ends of the machine, and accordingly, averagely dividing the testing interfaces into two sets based on the middle of the machine; and during testing, the first tester and the second tester move relative to each other in a motion direction.

Optionally, the testers include a first tester and a second tester; the preset scheme includes: setting initial positions of the first tester and the second tester at the same end of the machine, and accordingly, averagely dividing the testing interfaces into two sets according to a rule of odd and even rows; and during testing, the first tester and the second tester synchronously move from one end of the machine to the other end.

Optionally, each of the array substrates corresponds to two testing interfaces.

The present application further discloses a testing device of array substrates, including: a machine, configured to place a plurality of array substrates to be tested; testing interfaces disposed on the machine and corresponding to each of the array substrates; and testers disposed above the machine and matched with the testing interfaces to carry out an electrical stress test and a power-on test on the array substrates, where there are at least two sets of testers, and the testers synchronously operate according to a preset scheme;

the testers include a first tester and a second tester; the first tester is located in front of the second tester in a testing direction; and the preset scheme includes: the first tester carries out the electrical stress test, and the second tester carries out the power-on test;

a length of the tester is at least equal to a width of a testing region of the machine; when starting operating, the second tester first carries out the electrical stress test and then carries out the power-on test; the first tester only carries out the electrical stress test, and then the second tester only carries out the power-on test on the testing interfaces tested by the first tester.

The present application further discloses a testing method for a testing device of array substrates. The testing device of array substrates includes: a machine, configured to place a plurality of array substrates to be tested; and testing interfaces disposed on the machine and corresponding to each of the array substrates; the testing method includes: placing at least two sets of testers on a machine; connecting the testers to testing interfaces; and synchronously operating the testers according to a preset scheme to carry out an electrical stress test and a power-on test on the array substrates.

Optionally, the testers include a first tester and a second tester; the first tester is located in front of the second tester in a testing direction; and the preset scheme includes: the first tester carries out the electrical stress test, and the second tester carries out the power-on test.

Optionally, a length of the tester is at least equal to a width of a testing region of the machine; when starting operating, the second tester first carries out the electrical stress test and then carries out the power-on test; and then the second tester only carries out the power-on test on the testing interfaces tested by the first tester.

Optionally, the preset scheme includes: averagely dividing the testing interfaces into at least two sets, each set of the testers correspondingly testing a set of the testing interfaces.

Optionally, the testers include a first tester and a second tester; the preset scheme includes: setting initial positions of the first tester and the second tester at both ends of the machine, and accordingly, averagely dividing the testing interfaces into two sets based on the middle of the machine; and during testing, the first tester and the second tester move relative to each other in a motion direction.

Optionally, the testers include a first tester and a second tester; the preset scheme includes: setting initial positions of the first tester and the second tester at the same end of the machine, and accordingly, averagely dividing the testing interfaces into two sets according to a rule of odd and even rows; and during testing, the first tester and the second tester synchronously move from one end of the machine to the other end.

Optionally, each of the array substrates corresponds to two testing interfaces.

Optionally, the testers include a first tester and a second tester; the first tester is located in front of the second tester in a testing direction; and the first tester and the second tester start operating at different times.

Optionally, the first tester and the second tester are simultaneously disposed at corresponding testing interfaces, and the first tester starts testing earlier than the second tester.

The testing device has at least two sets of testers. Compared to only using a single tester, during testing, the single tester first carries out an electrical stress test, and then carries out a power-up test. In the whole testing process, the tester needs to first carry out the electrical stress test every time it moves to the position of the testing interface, and then start the power-on test, the testing time is equal to a sum of the electrical stress test time and the power-on test time; as a result, other sets of testers are relatively wasted, and all testers are not effectively used. Therefore, by using at least two sets of testers to operate synchronously, the present application effectively utilizes the testers and also saves the testing time, thereby effectively saving the operating procedure.

BRIEF DESCRIPTION OF DRAWINGS

The drawings are included to provide further understanding of embodiments of the present application, which constitute a part of the specification and illustrate the embodiments of the present application, and describe the principles of the present application together with the text description. Apparently, the accompanying drawings in the following description show merely some embodiments of the present application, and a person of ordinary skill in the art may still derive other accompanying drawings from these accompanying drawings without creative efforts.

In the accompanying drawings.

DETAILED DESCRIPTION

The specific structure and function details of the present application are merely representative, and are intended to describe exemplary embodiments of the present application. However, the present application can be specifically embodied in many alternative forms, and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two elements. The specific meanings about the foregoing terms in the present application may be understood by a person of ordinary skill in the art according to specific circumstances.

The terms used herein are merely for the purpose of describing the specific embodiments, and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

In the drawings, units of similar structures are represented by the same reference numeral.

Figure 1:
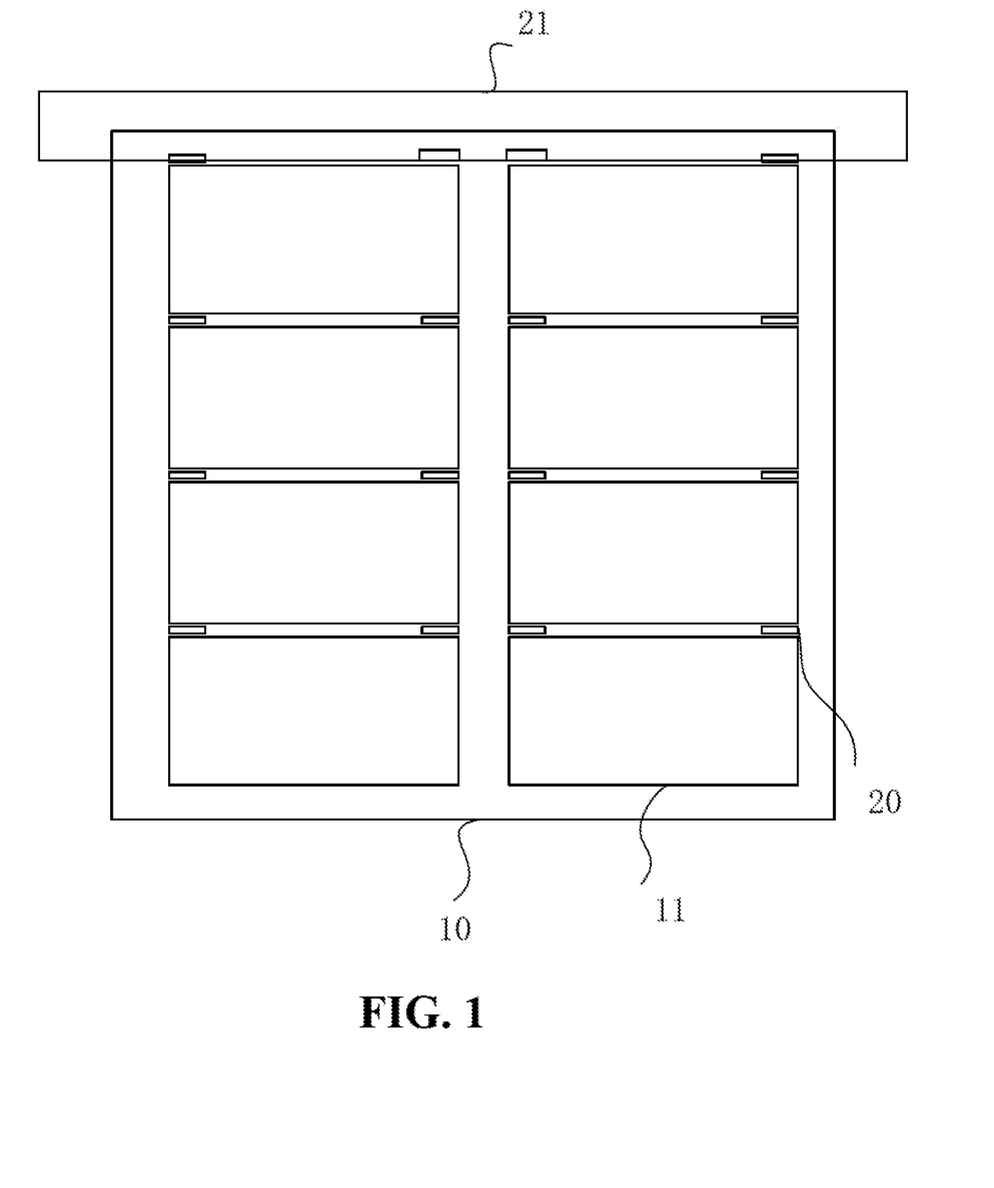
FIG. 1 is a schematic diagram of the operation of one set of testers.
Figure 2:
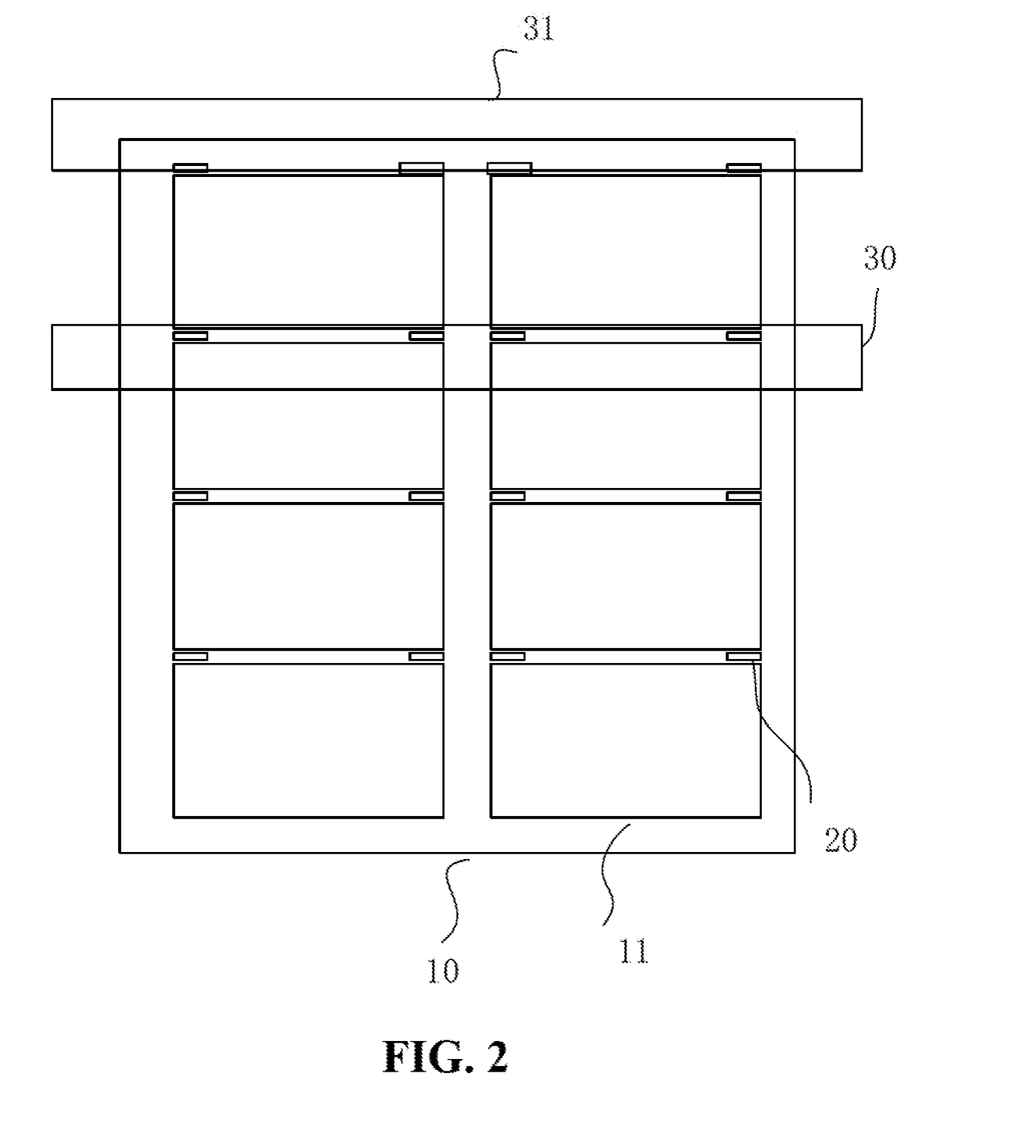
FIG. 2 is a schematic diagram of the operation of two sets of testers at the same side according to an embodiment of the present application.
Figure 3:
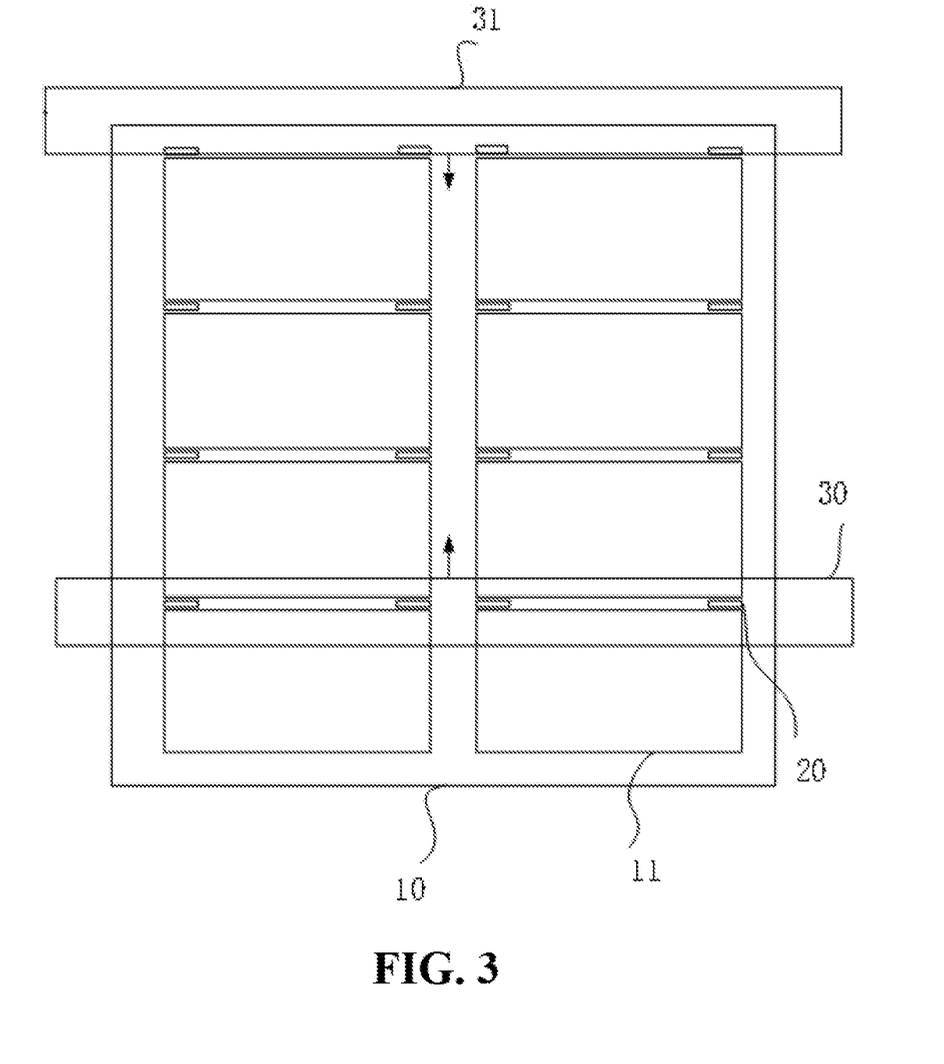
FIG. 3 is a schematic diagram of the operation of two sets of testers at different sides according to another embodiment of the present application.

As shown in FIGS. 2 and 3, the present application discloses a testing device of array substrates, including: a machine 10, configured to place a plurality of array substrates 11 to be tested; testing interfaces 20 disposed on the machine 10 and corresponding to each of the array substrates 11; and testers 21 disposed above the machine 10 and matched with the testing interfaces 20, a length of the tester 21 being at least equal to a width of a testing region of the machine 10, to carry out an electrical stress test and a power-on test on the array substrates 11, where there are at least two sets of testers 21, and the testers 21 synchronously operate according to a preset scheme.

The testing device has at least two sets of testers 21. Compared to only using a single tester 21, during testing, the single tester 21 first carries out an electrical stress test, and then carries out a power-up test. In the whole testing process, the tester 21 needs to first carry out the electrical stress test every time it moves to the position of the testing interface 20, and then start the power-on test, the testing time is equal to a sum of the electrical stress test time and the power-on test time; as a result, other sets of testers 21 are relatively wasted, and not all testers 21 are effectively used. Therefore, by using at least two sets of testers 21 to operate synchronously, the present application effectively utilizes the testers 21 and also saves the testing time, thereby effectively saving the operating procedure.

Optionally, in this embodiment, the testers 21 include a first tester 30 and a second tester 31; the first tester 30 is located in front of the second tester 31 in a testing direction; and the preset scheme includes: the first tester 30 carries out the electrical stress test, and the second tester 31 carries out the power-on test.

Compared to the operation of using one set of testers 21, using two sets of testers 21 will double the amount of test per unit time, thereby improving the operating efficiency. In the present application, the first tester 30 is configured to carry out the electrical stress test, and the second tester 31 is configured to carry out the power-on test. Such labor-division cooperation can make the operation orderly, and can improve the operating efficiency of the testers 21, and thus avoid loss caused by converting the modes of each set of testers 21.

Optionally, in this embodiment, a length of the tester is at least equal to a width of a testing region of the machine; when starting operating, the second tester 31 first carries out the electrical stress test and then carries out the power-on test; and then the second tester 31 only carries out the power-on test on the testing interfaces 20 tested by the first tester 30.

Two sets of testers 21 can operate together, but cannot carry out the electrical stress test in advance. Therefore, in the present application, when starting operating, the second tester 31 carries out the electrical stress test and the power-on test, and the first tester 30 only carries out the electrical stress test, and then the second tester 31 only carries out the power-on test on the testing interfaces 20 tested by the first tester 30, which is equivalent to the electrical stress test 30 in the whole test only takes the electrical stress time once, saving the time of the testing process. Moreover, compared to one set of testers 21, the present application improves the testing efficiency.

Optionally, in this embodiment, the preset scheme includes: averagely dividing the testing interfaces 20 into at least two sets, each set of the testers 21 correspondingly testing a set of the testing interfaces 20.

The product testing process of the tester 21 is actually bidirectional, and the product has a feedback process to the tester 21. Assume that the tester 21 fails, there is no change in the test of any testing interface 20, and then a problem occurs after the product is used. At this time, according to the problem of the product, the testing interface 20 can find the fault tester 21 correspondingly. Therefore, in the present application, the testing interfaces 20 are averagely divided into at least two sets, and each set of testers 21 correspondingly tests one set of testing interfaces 20, so that the utilization of the testers 21 can be improved, and the traceability of testing records can also be achieved.

Figure 4:
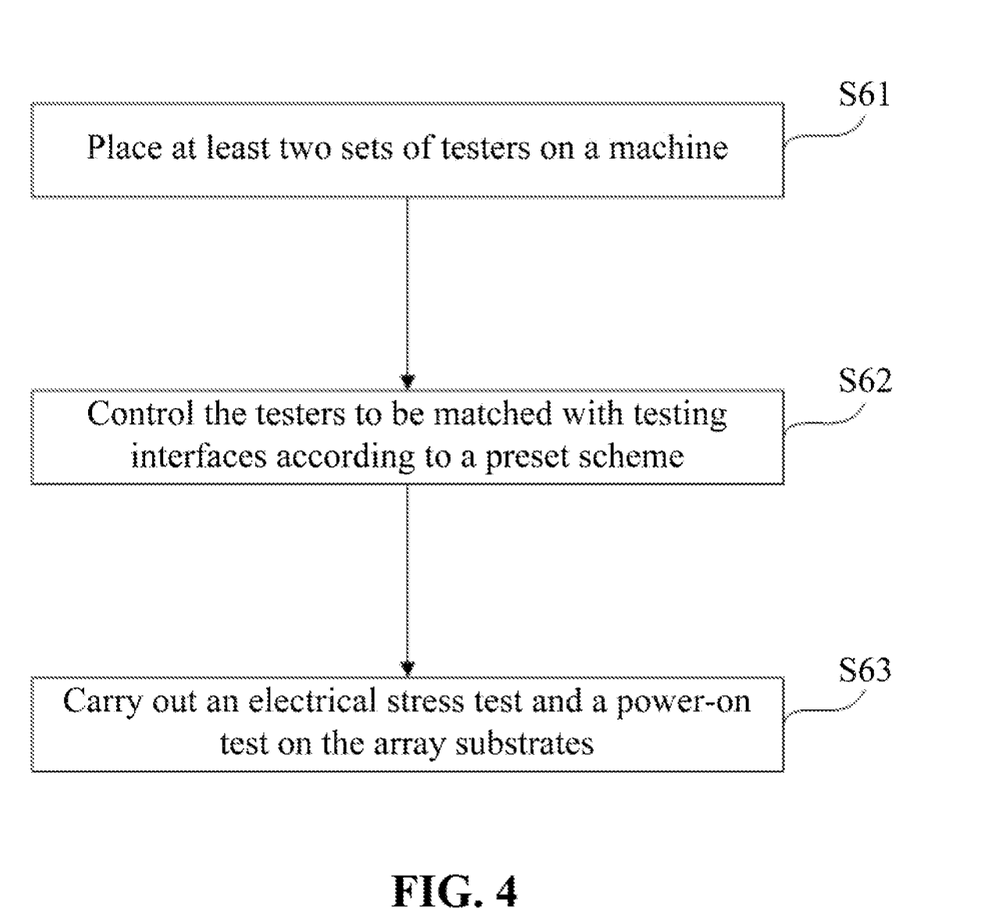
FIG. 4 is a schematic flowchart of a testing method according to an embodiment of the present application.

As shown in FIG. 4, optionally, in this embodiment, the testers 21 include a first tester 30 and a second tester 31; the preset scheme includes: setting initial positions of the first tester 30 and the second tester 31 at both ends of the machine 10, and accordingly, averagely dividing the testing interfaces 20 into two sets based on the middle of the machine 10; and during testing, the first tester 30 and the second tester 31 move relative to each other in a motion direction.

Each tester 21 can complete the testing of all array substrates 11 only by moving by a distance half the length of the machine 10, the moving distance is relatively small, the testing efficiency is improved, and moreover, bidirectional feedback between the product and the tester 21 can be achieved.

Optionally, in this embodiment, the testers 21 include a first tester 30 and a second tester 31; the preset scheme includes: setting initial positions of the first tester 30 and the second tester 31 at the same end of the machine 10, and accordingly, averagely dividing the testing interfaces 20 into two sets according to a rule of odd and even rows; and during testing, the first tester 30 and the second tester 31 synchronously move from one end of the machine 10 to the other end.

When two sets of testers 21 simultaneously operate, the time of testing each testing interface 20 is basically the same. Therefore, changing the position of the next testing interface 20 by two sets of testers 21 should be synchronous actually. Initial positions of the first tester 30 and the second tester 31 are set at the same end, and accordingly, the testing interfaces 20 are averagely divided into two sets according to a rule of odd and even rows; and during testing, the first tester 30 and the second tester 31 synchronously move from one end of the machine 10 to the other end, so that the two sets of testers 21 always keep close to each other, to facilitate operation, thereby relatively saving the time of changing the position of the testing interface 20 and improving the operating efficiency, and moreover, bidirectional feedback between the product and the tester 21 can be achieved.

Optionally, in this embodiment, each of the array substrates 11 corresponds to two testing interfaces 20.

As another embodiment of the present application, as shown in FIGS. 2 and 3, the present application further discloses a testing method for a testing device of array substrates. The testing device of array substrates 11 includes: a machine 10, configured to place a plurality of array substrates 11 to be tested; and testing interfaces 20 disposed on the machine 10 and corresponding to each of the array substrates 11; the testing method includes: placing at least two sets of testers 21 on a machine 10; connecting the testers 21 to testing interfaces 20; and synchronously operating the testers 21 according to a preset scheme to carry out an electrical stress test and a power-on test on the array substrates 11.

The testing device has at least two sets of testers 21. Compared to only using a single tester 21, during testing, the single tester 21 first carries out an electrical stress test, and then carries out a power-up test. In the whole testing process, the tester 21 needs to first carry out the electrical stress test every time it moves to the position of the testing interface 20, and then start the power-on test, the testing time is equal to a sum of the electrical stress test time and the power-on test time; as a result, other sets of testers 21 are relatively wasted, and not all testers 21 are effectively used. Therefore, by using at least two sets of testers 21 to operate synchronously, the present application effectively utilizes the testers 21 and also saves the testing time, thereby effectively saving the operating procedure.

Optionally, in this embodiment, the testers 21 include a first tester 30 and a second tester 31; the first tester 30 is located in front of the second tester 31 in a testing direction; and the preset scheme includes: the first tester 30 carries out the electrical stress test, and the second tester 31 carries out the power-on test.

Since the electrical stress test consumes less time than the power-on test, assume that the first test 30 carries out the electrical stress test, and the second tester 31 carries out the power-on test, and thus the first tester 30 "runs" faster than the second tester 31. Therefore, during testing, two testers 21 are not interfered to each other. Moreover, for the whole testing process, the electrical stress test is equivalent to only consuming the electrical stress test time of one testing interface 20, thereby saving the time of the testing process.

Optionally, in this embodiment, a length of the tester 21 is at least equal to a width of a testing region of the machine 10; when starting operating, the second tester 31 first carries out the electrical stress test and then carries out the power-on test; and then the second tester 31 only carries out the power-on test on the testing interfaces 20 tested by the first tester 30.

Since the tester 21 needs to test the testing region of the machine 10, it should be met that the length of the tester 21 is at least equal to the width of the testing region of the machine 10, otherwise, missing testing positions would easily occur. The second tester 31 and the first tester 30 operate cooperatively, the two tester start testing together, the first tester 30 is only in charge of the electrical stress test, and the second tester 31 completes the electrical stress test and the power-on test when starting operating, and then is only in charge of carrying out the power-on test on the testing interfaces 20 subjected to the electrical stress test of the first tester 30, thereby saving the time of the electrical stress test and improving the testing efficiency.

Optionally, in this embodiment, the preset scheme includes: averagely dividing the testing interfaces 20 into at least two sets, each set of the testers 21 correspondingly testing a set of the testing interfaces 20.

The product testing process of the tester 21 is actually bidirectional, and the product has a feedback process to the tester 21. Assume that the tester 21 fails, there is no change in the test of any testing interface 20, and then a problem occurs after the product is used. At this time, according to the problem of the product, the testing interface 20 can find the fault tester 21 correspondingly. Therefore, in the present application, the testing interfaces 20 are averagely divided into at least two sets, and each set of testers 21 correspondingly tests one set of testing interfaces 20, so that the utilization of the testers 21 can be improved, and the traceability of testing records can also be achieved.

Optionally, in this embodiment, the testers 21 include a first tester 30 and a second tester 31; the preset scheme includes: setting initial positions of the first tester 30 and the second tester 31 at both ends of the machine 10, and accordingly, averagely dividing the testing interfaces 20 into two sets based on the middle of the machine 10; and during testing, the first tester 30 and the second tester 31 move relative to each other in a motion direction.

Each tester 21 can complete the testing of all array substrates 11 only by moving by a distance half the length of the machine 10, the moving distance is relatively small, the testing efficiency is improved, and moreover, bidirectional feedback between the product and the tester 21 can be achieved.

Optionally, in this embodiment, the testers 21 include a first tester 30 and a second tester 31; the preset scheme includes: setting initial positions of the first tester 30 and the second tester 31 at the same end of the machine 10, and accordingly, averagely dividing the testing interfaces 20 into two sets according to a rule of odd and even rows; and during testing, the first tester 30 and the second tester 31 synchronously move from one end of the machine 10 to the other end.

When two sets of testers 21 simultaneously operate, the time of testing each testing interface 20 is basically the same. Therefore, changing the position of the next testing interface 20 by two sets of testers 21 should be synchronous actually. Initial positions of the first tester 30 and the second tester 31 are set at the same end, and accordingly, the testing interfaces 20 are averagely divided into two sets according to a rule of odd and even rows; and during testing, the first tester 30 and the second tester 31 synchronously move from one end of the machine 10 to the other end, so that the two sets of testers 21 always keep close to each other, to facilitate operation, thereby relatively saving the time of changing the position of the testing interface 20 and improving the operating efficiency, and moreover, bidirectional feedback between the product and the tester 21 can be achieved.

Optionally, in this embodiment, the testers 21 include a first tester 30 and a second tester 31; the first tester 30 is located in front of the second tester 31 in a testing direction; and the first tester 30 and the second tester 31 start operating at different times.

Compared to the operation of one tester 21, two testers 21 can greatly improve the operating efficiency. If two testers 21 simultaneously start operating, it means that an operator needs to simultaneously operate two testers 21, and there is a possibility that the operation will be difficult and the testing will go wrong. Therefore, in the present application, the first tester 30 and the second tester 31 start operating at different times. In this way, the operator can well operate two sets of testers 21 according to the time difference generated when the first tester 30 and the second tester 31 operate, thereby avoiding leakage due to busyness and improving testing efficiency.

Optionally, in this embodiment, the first tester 30 and the second tester 31 are simultaneously disposed at corresponding testing interfaces 20, and the first tester 30 starts testing earlier than the second tester 31.

Because the first tester 30 is located in front of the second tester 31, to make two sets of testers 21 not interfere to each other, in the present application, the first tester 30 starts testing earlier than the second tester 31, so that the first tester 30 and the second tester 31 are not interfered to each other, thereby facilitating the operation of the operator and greatly improving the operating efficiency.

Optionally, in this embodiment, each array substrate corresponds to two testing interfaces.

Optionally, in this embodiment, the preset scheme includes any of the foregoing preset schemes, and the effects of shortening the testing time and improving the testing efficiency can be achieved.

As another embodiment of the present application, as shown in FIGS. 2 and 3, the present application further discloses a testing method for array substrates 11. The testing device of array substrates 11 includes: a machine 10, configured to place a plurality of array substrates 11 to be tested; and testing interfaces 20 disposed on the machine 10 and corresponding to each of the array substrates 11; the testing method includes: S61: place at least two sets of testers 21 on a machine 10; S62: control the testers 21 to be matched with testing interfaces 20 according to a preset scheme; and S63: carry out an electrical stress test and a power-on test on the array substrates 11.

At least two sets of testers 21 are disposed on the machine 10. Compared to the operation of one set of testers 21, by means of the same preset scheme, at least two sets of testers 21 can double the amount of test per unit time, thereby improving the operating efficiency. Moreover, at least two sets of testers 21 can be simultaneously installed on the same machine, and in this way, the testers 21 are adequately utilized, and the time of the testing process is also saved.

It should be noted that the limitation of various steps involved in the present solution is not intended to limit the sequence of steps, without affecting the implementation of the specific solution. The previous steps may be executed first, and can also be executed later, or can even be executed at the same time. As long as the present solution can be implemented, these steps should be considered to be within the scope of protection of the present application.

The contents above are further detailed descriptions of the present application in conjunction with optional specific embodiments, and the specific implementation of the present application is not limited to these descriptions. It will be apparent to those skilled in the art that various simple deductions or substitutions may be made without departing from the spirit of the present application, and should be considered to be within the scope of protection of the present application.

What is claimed is:

1. A testing device for testing array substrates for a display panel, comprising:
   a worktable, configured to place a plurality of array substrates to be tested;
   testing interfaces disposed on the worktable and corresponding to each of the array substrates; and
   testers disposed on the worktable and matched with the testing interfaces to carry out an electrical stress test and a power-on test on the array substrates;
   there are at least two testers, and the testers synchronously operate according to a preset scheme, wherein the at least two testers are all disposed above the plurality of array substrates for performing the electrical stress test and the power-on test on the array substrates;
   wherein the testers comprise a first tester and a second tester; the first tester is located in front of the second tester in a testing direction by a distance of at least one row of one or more array substrates; and the preset scheme comprises: the first tester carries out the electrical stress test on the plurality of array substrates successively on a one-row-by-one-row basis, and the second tester carries out the power-on test on each row of the plurality of array substrates that has finished the electrical stress test performed by the first tester;
   wherein the plurality of array substrates are mounted on the worktable in aligned rows and columns, and each row comprises at least one aligned array substrate, wherein the first tester and the second tester are each disposed in parallel with a row orientation of the array substrates, wherein initially the first tester is placed at one end of a second row at which the testing interfaces of the at least one aligned array substrate of the second row are disposed, and the second tester is placed at one end of a first row where the testing interfaces of the at least one aligned array substrate of the first row are disposed, and wherein since this time the first tester is configured to perform the electrical stress test on the at least one aligned array substrate of the second row simultaneously and then relatively move to the third row and perform the electrical stress test on the at least one array substrate of the third row simultaneously, and at same steps the second tester is configured to perform the power-on test on the at least one aligned array substrate of the first row simultaneously and then relatively move to the second row and perform the power-on test on the at least one aligned array substrate of the second row simultaneously which has finished the electrical stress test performed by the first tester, and wherein the above process is continued until the first tester reaches the last row and both the electrical stress test and the power-on test have been performed on each of the plurality of array substrates.

2. The testing device of array substrates according to claim 1, wherein each of the array substrates corresponds to two testing interfaces.

3. The testing device according to claim 1, wherein one and only one instance of the electrical stress test and one and only one instance of the power-on test are performed on each of the plurality of array substrates, and wherein for each of the plurality of array substrates the electrical stress test is performed before the power-on test.

4. The testing device according to claim 1, wherein a length of the tester is equal to or greater than a width of a testing region of the worktable; when starting operating, the second tester first carries out the electrical stress test and then carries out the power-on test on the at least one aligned array substrate of the first row, while synchronously the first tester is carrying out the electrical stress test on the at least one aligned array substrate of the second row; and then the second tester only carries out the power-on test on the testing interfaces that have been tested by the first tester, until both the electrical stress test and the power-on test have been performed on each of the plurality of array substrates.

5. The testing device according to claim 1, wherein the plurality of array substrates are arranged on the worktable in two columns and so each row comprises two aligned array substrates.

6. A testing method for a testing device for testing array substrates for a display panel, the testing device comprising:
   a worktable, configured to place a plurality of array substrates to be tested; and
   testing interfaces disposed on the worktable and corresponding to each of the array substrates;
   the testing method comprises:
   placing at least two testers on a worktable;
   connecting the testers to testing interfaces; and
   synchronously operating the testers according to a preset scheme to carry out an electrical stress test and a power-on test on the array substrates;
   wherein the at least two testers are all disposed above the plurality of array substrates for performing the electrical stress test and the power-on test on the array substrates;
   wherein the testers comprise a first tester and a second tester; the first tester is located in front of the second tester in a testing direction by a distance of at least one row of one or more array substrates; and the preset scheme comprises: the first tester carries out the electrical stress test on the plurality of array substrates successively on a one-row-by-one-row basis, and the second tester carries out the power-on test on each row of the plurality of array substrates that has finished the electrical stress test performed by the first tester;

wherein the plurality of array substrates are mounted on the worktable in aligned rows and columns, and each row comprises at least one aligned array substrate, wherein the first tester and the second tester are each disposed in parallel with a row orientation of the array substrates, wherein initially the first tester is placed at one end of a second row at which the testing interfaces of the at least one aligned array substrate of the second row are disposed, and the second tester is placed at one end of a first row where the testing interfaces of the at least one aligned array substrate of the first row are disposed, and wherein a length of the tester is equal to or greater than a width of a testing region of the worktable; when starting operating, the second tester first carries out the electrical stress test and then carries out the power-on test on the at least one aligned substrate of the first row, while the first tester is synchronously carrying out the electrical stress test on the at least one aligned array substrate of the second row; and then the second tester only carries out the power-on test on the testing interfaces that have been tested by the first tester, until both the electrical stress test and the power-on test have been performed on each of the plurality of array substrates.

\* \* \* \* \*